United States Patent
Ueda et al.

(10) Patent No.: US 6,866,723 B2
(45) Date of Patent: Mar. 15, 2005

(54) WET CLEANING PROCESS AND WET CLEANING EQUIPMENT

(75) Inventors: Takeji Ueda, Okayama (JP); Koji Oka, Okayama (JP); Sanae Sumi, Okayama (JP)

(73) Assignee: m.FSI Ltd., Tokyo (JP)

( * ) Notice: Subject to any disclaimer, the term of this patent is extended or adjusted under 35 U.S.C. 154(b) by 33 days.

(21) Appl. No.: 09/921,555

(22) Filed: Aug. 6, 2001

(65) Prior Publication Data

US 2002/0036006 A1 Mar. 28, 2002

(30) Foreign Application Priority Data

Aug. 9, 2000 (JP) ........................................ 2000-241168

(51) Int. Cl.[7] .............................................. B08B 7/00
(52) U.S. Cl. ............................ 134/33; 134/2; 134/25.1; 134/26; 134/29; 134/34; 438/906; 510/175
(58) Field of Search ............................ 134/2, 25.1, 26, 134/29, 33, 34, 3, 6, 8, 17, 19, 27, 28, 32, 36, 42, 153, 157, 198, 200, 902; 438/906; 510/175; 132/2, 3, 26, 32, 33, 34; 252/79.3, 79.4

(56) References Cited

U.S. PATENT DOCUMENTS

| | | | |
|---|---|---|---|
| 3,769,992 A | | 11/1973 | Wallestad .................... 134/138 |
| 3,990,462 A | | 11/1976 | Elftmann et al. ............ 134/102 |
| 4,132,567 A | | 1/1979 | Blackwood .................... 134/1 |
| 4,197,000 A | | 4/1980 | Blackwood .................. 354/323 |
| 4,609,575 A | | 9/1986 | Burkman ..................... 427/426 |
| 4,682,615 A | | 7/1987 | Burkman et al. ............ 134/102 |
| 4,694,852 A | | 9/1987 | Grant .......................... 137/501 |
| 4,750,505 A | * | 6/1988 | Inuta et al. .................. 134/153 |
| 4,801,335 A | | 1/1989 | Burkman et al. ........... 134/25.4 |
| 4,815,630 A | | 3/1989 | Jenson et al. ............... 220/378 |
| 5,132,038 A | * | 7/1992 | Kukanskis et al. ......... 252/139 |
| 5,320,709 A | * | 6/1994 | Bowden et al. ............. 438/745 |
| 5,888,308 A | * | 3/1999 | Sachdev et al. ............... 134/1 |

FOREIGN PATENT DOCUMENTS

| | | | |
|---|---|---|---|
| GB | 2 154 434 | * | 9/1985 |
| JP | 52-12774 | * | 1/1977 |

OTHER PUBLICATIONS

Handbook of semiconductor wafer cleaning technology. Edited by W.Kem, 1993 by Noyes Publications, pp. 3, 137–141.*
Kern, W. J.Electrochem. Soc. 137(6): 1887–1892 (1990).*
Burkman, D.C. Semiconductor International, 4(7):109–111 (1984).*
Menon, V.B. and Donavan, R.P. Microcontamination, 8(11):29–34.*

* cited by examiner

*Primary Examiner*—M. Kornakov
(74) *Attorney, Agent, or Firm*—Oblon, Spivak, McClelland, Maier & Neustadt, P.C.

(57) ABSTRACT

A wet treatment method useful in one of a chemical processing and a rinsing step performed upon fabrication of semiconductor devices. A substrate is treated with a desired liquid while revolving the substrate around an axis of rotation outside the substrate such that the liquid flowing on a surface of the substrate is maintained flowing under a centrifugal force greater than gravitation. The substrate is treated while supplying the liquid at a flow rate at least equal to a discharge rate of the liquid only in a direction conforming with that of the centrifugal force or with that of a flow of the liquid flowing on the surface of the substrate under the centrifugal force. The substrate surface is evenly treated with the liquid while avoiding flows of the liquid running against each other or a flow of the liquid stagnating on the surface of the substrate.

20 Claims, 7 Drawing Sheets

WET CLEANING PROCESS AND WET CLEANING EQUIPMENT

BACKGROUND OF THE INVENTION a) Field of the Invention

This invention relates to a wet treatment method and apparatus effective for use in a fabrication process of semiconductor devices.

b) Description of the Related Art

RIE (reactive ion etching) has long been used in a metallization step for semiconductor devices. In such a step, deposits of a reaction product called, "polymer" or "wall pieces" remains on a surface of an etched substrate. A polymer stripper treatment step has, therefore, been needed to remove the deposits after the etching. Many of chemicals useful in the polymer stripper treatment step have high viscosity and are expensive, and a significant load is required for the treatment of waste water. Such chemicals are, therefore, circulated and reused in many instances. To permit effective handling of a chemical the composition of which tends to vary due to evaporation or the like, the treatment with the chemical as a polymer stripper is widely conducted by suitably supplying the chemical from a circulating tank onto a surface of a substrate only when the treatment is conducted rather than a bath-type treatment that a substrate is dipped in the chemical. To meet requirements for this treatment, a variety of treatment apparatuses have been developed, including single-wafer or batch processing apparatuses and apparatuses equipped with a mechanism for spraying a chemical onto plural substrates while causing the substrates to rotate (or eccentrically rotate) or to revolve U.S. Pat. No. 4,132,567 that issued on Jan. 2, 1979, U.S. Pat. No. 4,682,615 (Ser. No. 626,702 filed on Jul. 2, 1984). and U.S. Pat. No. 4,609,575 (Ser. No. 626,640 filed on Jul. 2, 1984)).

As examples of chemicals effective for the removal of the above-mentioned polymer, solutions containing an amine and ammonium fluoride dissolved as effective components in a solvent called a "semi-aqueous solvent" are used widely. These chemicals often use, as a solvent, an organic solvent in combination with water to reduce dissociation of such effective components because, if these effective components are simply added to water, they ionize or otherwise dissociate and exhibit unduly high reactivity. Accordingly, the solvent employed in such a chemical is a water-containing organic solvent having high viscosity in many instances. The solvent, hence, tends to remain on each substrate subsequent to its treatment with a polymer stripper, thereby giving a rise to a need for rinsing. Therefore, rinsing is often conducted using water.

The rinsing of a substrate subsequent to its treatment with a chemical effective for the removal of the above-mentioned polymer is, however, accompanied by a problem in that mixing of the chemical with water as a rinsing liquid results in a quick increase in etching rate and causes corrosion of metallization patterns and/or interconnections formed on the substrate. According to an investigation by the present inventors, this problem has been ascertained to markedly arise especially in a situation where the chemical is gradually mixed with water. To cope with this problem, it has thus been a rather common, conventional practice that intermediate or provisional rinsing is conducted to wash off the chemical once with a water-soluble solvent, followed by finish rinsing with water. In view of the environment, however, there is an increasing demand toward performing the rinsing with water alone without conducting the intermediate or provisional rinsing with such a solvent. As a result of an investigation on those removed by such rinsing, they have been found to include a polymer in a dissolved form and a polymer lift off and existing as particles (i.e., a residue). Upon rinsing, it is thus essential to achieve efficient dilution of the solvent and at the same time, effective elimination of these particles from the surface of the substrate.

In the conventional art, the etching rate tended to drop as an inorganic chemical was diluted. The conventional art has, therefore, been developed with a view to minimizing the supply flow rates of a polymer stripper chemical and rinsing water as much as possible in order to minimize the consumption of the inorganic chemical. In the conventional art, a polymer stripper chemical and rinsing water are supplied in small amounts in many instances. As their flow rates are low, the post-etching treatment has been conducted in such a way that, as a measure to meet the above-mentioned desire, a substrate under treatment is treated while rotating it at a low speed or the polymer stripper chemical or rinsing water is once caused to stand up on the surface of a substrate at a low rotation speed and the rotation speed of the substrate is then increased to a high speed to promptly spin it off in its entirety.

On the other hand, an increasing number of polymer strippers has been developed with a view to permitting rinsing with water only. Even with such polymer strippers, it is still impossible to completely avoid the above-mentioned increase in etching rate, which takes place upon rinsing. As a consequence, the etching rate is observed to reach a peak in the course of dilution with rinsing water. Even when a chemical permitting rinsing with only water is used as mentioned above, there is still a demand for the development of a solution regarding how to dilute the chemical quickly with only water to such a low concentration as causing no corrosion, in other words, how to achieve the liquid/liquid replacement with a high efficiency. Especially under a situation that metals of different kinds are in contact with each other and galvanic corrosion hence tends to occur, the conventional rinsing method of a substrate surface with water at such a low flow rate as mentioned above has difficulty in completely avoiding corrosion, leading to an outstanding desire for the development of a method which can achieve the liquid/liquid replacement with a high efficiency.

In general, an inefficient rinsing method requires a longer rinsing time and results in a greater consumption of rinsing water. Such an inefficient rinsing method is, therefore, undesired not only from the standpoint of cost but also from the standpoint of influence to the environment. In all wet treatments, it is thus widely required to heighten the efficiency of rinsing.

In rinsing, particles which have been lifted off have to be removed from the surface of a substrate as mentioned above. A polymer stripper such as that described above or its diluted solution, however, does not necessarily have such a pH as causing the particles to electrically repel in the solution from the substrate. In some instances, these particles may be readily adsorbed on the surface of the substrate, thereby making it difficult to remove them. As a method for permitting removal of particles under any pH conditions, it is necessary to apply a physical external force. Toward this direction, wet treatment methods making use of various physical forces have been under investigation in recent years. Use of a physical force such as ultrasonic waves or brushing, for example, can certainly improve the efficiency of particle removal, but on the other hand, the use of such a physical force has been reported to develop another problem in that semiconductor devices are damaged. It is, therefore, desired to develop a method which does not damage semiconductor devices while heightening the efficiency of a liquid/liquid replacement such as between a chemical and rinsing water. This desire is common to every general wet cleaning.

SUMMARY OF THE INVENTION

An object of the present invention is, therefore, to provide a wet treatment method and apparatus, which with a small supply of a treatment liquid, can promptly achieve an even liquid/liquid replacement with high efficiency on a surface of a substrate without allowing the liquids to remain locally.

Another object of the present invention is to provide a wet treatment method and apparatus, which can minimize corrosion of metallization patterns, interconnections and/or the like or the amount of a polymer remaining as particles on a surface of a substrate especially in water rinsing which is a rinsing treatment applied subsequent to treatment with a chemical and is known to result in marked occurrence of deleterious effect to the surface of the substrate due to an increase in etching rate by dilution with water.

A further object of the present invention is to provide a wet treatment method and apparatus which, when applied to rinsing in such a situation that the viscosity or adhesion of a used chemical is high and its remaining on a surface of a substrate causes a problem or when supplying a chemical or supplying a rinsing liquid to remove the chemical, can achieve a liquid/liquid replacement with high efficiency by reducing the supply rate of the liquid or chemical as much as possible and feeding a fresh supply of the liquid or chemical as fast as possible.

A still further object of the present invention is to provide a wet treatment method and apparatus, which can be effectively used especially upon conducting rinsing after treatment with a chemical containing an organic substance and employed in a removal step of residues from resist stripping or etching or upon conducing rinsing after treatment with a chemical containing an organic substance and employed in a removal step of residues (particles) from resist stripping or etching when a metal is exposed as a ground on a substrate.

The above-described objects can be achieved by the present invention to be described hereinafter. Specifically, in one aspect of the present invention, there is a wet treatment method useful in at least one of a chemical processing step and a rinsing step performed upon fabrication of semiconductor devices, which comprises a sub-step in which:

a substrate under treatment is treated with a desired liquid while causing the substrate to revolve around an axis of rotation outside the substrate itself instead of allowing the substrate to rotate about the axis of rotation such that the liquid flowing on a surface of the substrate is maintained flowing under a centrifugal force greater than gravitation, and the substrate is treated while supplying a fresh liquid of the same kind as the desired liquid at a flow rate at least equal to a discharge rate of the desired liquid only in a direction conforming with that of the centrifugal force or with that of a flow of the liquid flowing on the surface of the substrate under the centrifugal force, whereby the substrate is evenly treated at the surface thereof with the desired liquid while avoiding development of such a situation that flows of the liquid run against each other on the surface of the substrate or a flow of the liquid stagnates on the surface of the substrate.

In another aspect of the present invention, there is also provided a wet treatment apparatus useful in at least one of a chemical processing step and a rinsing step performed upon fabrication of semiconductor devices, wherein:

the wet treatment apparatus is constructed such that a substrate under treatment is wet-treated with a desired liquid while being caused to revolve around an axis of rotation outside itself instead of being allowed to rotate about the axis of rotation; and the wet treatment apparatus is provided with a control system for maintaining the liquid, which is flowing on a surface of the substrate, to flow at a high speed under a centrifugal force greater than gravitation and also supplying a fresh liquid of the same kind as the desired liquid at a flow rate at least equal to a discharge rate of the desired liquid only in a direction conforming with that of the centrifugal force or with that of a flow of the liquid flowing on the surface of the substrate under the centrifugal force such that the substrate is evenly treated at the surface thereof with the desired liquid while avoiding development of such a situation that flows of the liquid run against each other on the surface of the substrate or a flow of the liquid stagnates on the surface of the substrate.

The present invention provides a wet treatment method and apparatus, which with a small supply of a treatment liquid, can promptly achieve an even liquid/liquid replacement with high efficiency on a surface of a substrate without allowing the liquids to remain locally.

The present invention also provides a wet treatment method and apparatus, which can minimize corrosion of metallization patterns, interconnections and/or the like or the amount of a polymer remaining as particles on a surface of a substrate especially in water rinsing which is a rinsing treatment applied subsequent to treatment with a chemical and is known to result in marked occurrence of deleterious effect to the surface of the substrate due to an increase in etching rate by dilution with water.

DETAILED DESCRIPTION OF THE INVENTION AND PREFERRED EMBODIMENTS

The present invention will hereinafter be described in detail based on certain preferred embodiments.

The present inventors have proceeded with an extensive investigation to solve the above-described problems of the conventional art. As a result, it has been found that to prevent or reduce an increase in etching rate in water rinsing, said increase having remained as a most detrimental problem and being not soluble by the efficiency of a replacement with rinsing water available in any one of the above-described conventional rinsing methods, the achievement of a high-speed replacement of a chemical with the rinsing water on the surface of a substrate is needed. It has also been found effective for the achievement of such a high-speed replacement to produce a centrifugal force greater than gravitation in a predetermined specific direction on the entire surface of the substrate and further, to include in an initial stage of the rinsing step a sub-step to supply rinsing water at a high speed in a direction conforming with a flow of the chemical produced under the centrifugal force on the surface of the substrate. It has also been found that these measures can avoid a reduction in the efficiency of rinsing and can hence achieve a high-speed, even replacement of the chemical with the rinsing water without allowing neither the chemical nor the rinsing water to remain. These findings have led to the completion of the present invention. According to the investigation by the present inventors, it has-also been found that the above-described centrifugal force and the flow of the rinsing water produced under this centrifugal force can bring about effects comparable with a physical external force and can be used effectively, for example, for the removal of particles from the surface of the substrate.

According to the investigation by the present inventors, it has also been found that an apparatus of the rotation type that a substrate under treatment rotates around an axis of rotation inside itself cannot produce sufficient centrifugal force in the vicinity of the axis of rotation and has difficulty in making a flow of a fresh supply of rinsing liquid conforming with a flow of liquid produced on a surface of the substrate under such insufficient centrifugal force. It has also been found that, even with an apparatus of the revolution type that a substrate does not have an axis of rotation inside itself, a flow of liquid on a surface of the substrate and a flow of a fresh supply of liquid on the surface of the substrate run against each other and causes corrosion of metallization patterns and/or interconnections formed on the substrate if the apparatus is constructed such that rinsing liquid is also supplied from the outside toward the axis of rotation as has been conventionally practiced to enhance the effect of rinsing.

According to the wet treatment method of the present invention, on the other hand, a substrate is firstly caused to revolve such that a centrifugal force greater than gravitation is produced by the revolution. As a result, a fresh supply of liquid to the surface of the substrate is provided with such a high flow velocity that would be unavailable unless the centrifugal force is applied, resulting in a liquid-to-liquid replacement with improved efficiency on the surface of the substrate. Further, the revolution of the substrate rather than its rotation has made it possible to allow the substrate to receive sufficient centrifugal force over the entire surface thereof, leading to a further improvement in the efficiency of the liquid-to-liquid replacement on the surface of the substrate. The wet treatment method according to the present invention is usable in at least one of a chemical processing step and a rinsing step, both of which are conducted upon fabrication of semiconductor devices. The wet treatment method is conducted such that a liquid flowing on the surface of the substrate is maintained flowing under a centrifugal force greater than gravitation to avoid development of such a situation that the flow of the liquid stagnates on the surface of the substrate. This has made it possible to prevent the liquid from remaining on the surface of the substrate and also to prevent corrosion of metallization patterns, inter-connections and/or the like formed on the substrate. In addition to the above-described requirements, the substrate is treated while supplying a fresh liquid at a flow rate at least equal to a discharge rate of the liquid only-in a direction conforming with that of the centrifugal force or with that of a flow of the liquid flowing on the surface of the substrate under the centrifugal force. This allows the liquid to always flow in a specific direction on the surface of the substrate, and the resulting flow of the liquid achieves a situation where the liquid flows over the entire surface of the substrate without causing such a situation that flows of the liquid run against each other. As a result, the substrate can be evenly treated at the entire surface thereof while preventing corrosion of metallization patterns, inter-connections and/or the like formed on the substrate and also preventing the liquid from remaining on the surface of the substrate due to formation of dry areas there.

The treatment sub-step is conducted in at least one of the chemical processing step and the rinsing step under conditions that the liquid flowing on the surface of the substrate is maintained flowing and that a fresh supply of a liquid of the same kind as the liquid is fed at a flow rate at least equal to a discharge rate of the liquid only in a direction conforming with that of the centrifugal force or with that of the flow of the liquid flowing on the surface of the substrate under the centrifugal force. This sub-step may be conducted in any stage of at least one of the chemical processing step and the rinsing step. According to a detailed investigation by the present invention, it has been found that advantageous effects of the present invention, which will be mentioned subsequently herein, can be more markedly brought about especially when the treatment sub-step is conducted in an initial stage of at least one of the chemical processing step and the rinsing step.

According to the wet treatment method of this invention including the treatment sub-step of the above-described features, it is possible, for example, to avoid a reduction in the efficiency of rinsing although such a reduction has heretofore occurred due to stagnation of liquid on the substrate as a result of running of a flow of the liquid and a flow of the fresh supply of the liquid against each other on the surface of the substrate in the conventional method in which the rinsing liquid is also supplied from the outside toward the axis of rotation. This has made it possible to promptly replace the chemical, which is remaining on the surface of the substrate, with the rinsing liquid and hence, to avoid corrosion of metallization patterns, interconnections and/or the like formed on the substrate. In addition, the wet treatment method of this invention including the treatment sub-step can also avoid an increase in etching rate although such an increase in etching rate may take place when the liquid is caused to stand up on the surface of the substrate. This has also made it possible to avoid corrosion of metallization patterns, interconnections and/or the like formed on the substrate. During the treatment, it is possible to always maintain a flow of liquid at a high speed over the entire surface of the substrate. This has made it possible to prevent occurrence of localized dry areas on the surface of the substrate in the course of the treatment, so that no liquid is allowed to remain on the surface of the substrate and the substrate can be evenly treated over the entire surface thereof. Described specifically, it is possible to evenly replace a liquid such as a chemical with another liquid such as another chemical or a rinsing liquid on the surface of the substrate in at least one of the chemical processing step and the rinsing step. Here, it is possible to allow the liquid to flow at a high speed comparable with a physical force so that particles can be removed from the surface of the substrate.

With reference to the accompanying drawings, the wet treatment apparatuses according to the first to fourth embodiments of the present invention will be described hereinafter.

Figure 1:
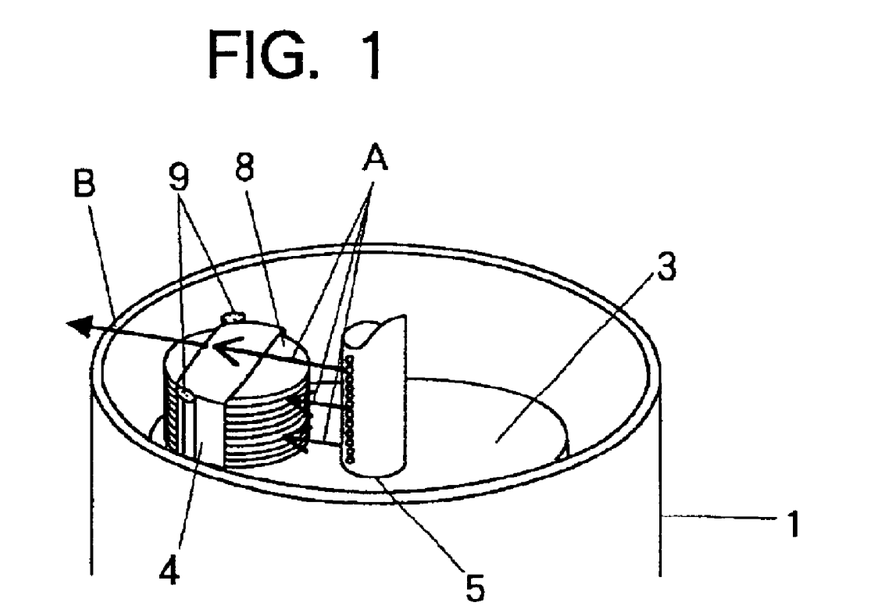
FIG. 1 is a fragmentary schematic perspective view of a treatment chamber in a wet treatment apparatus according to a first embodiment of the present invention.
Figure 2:
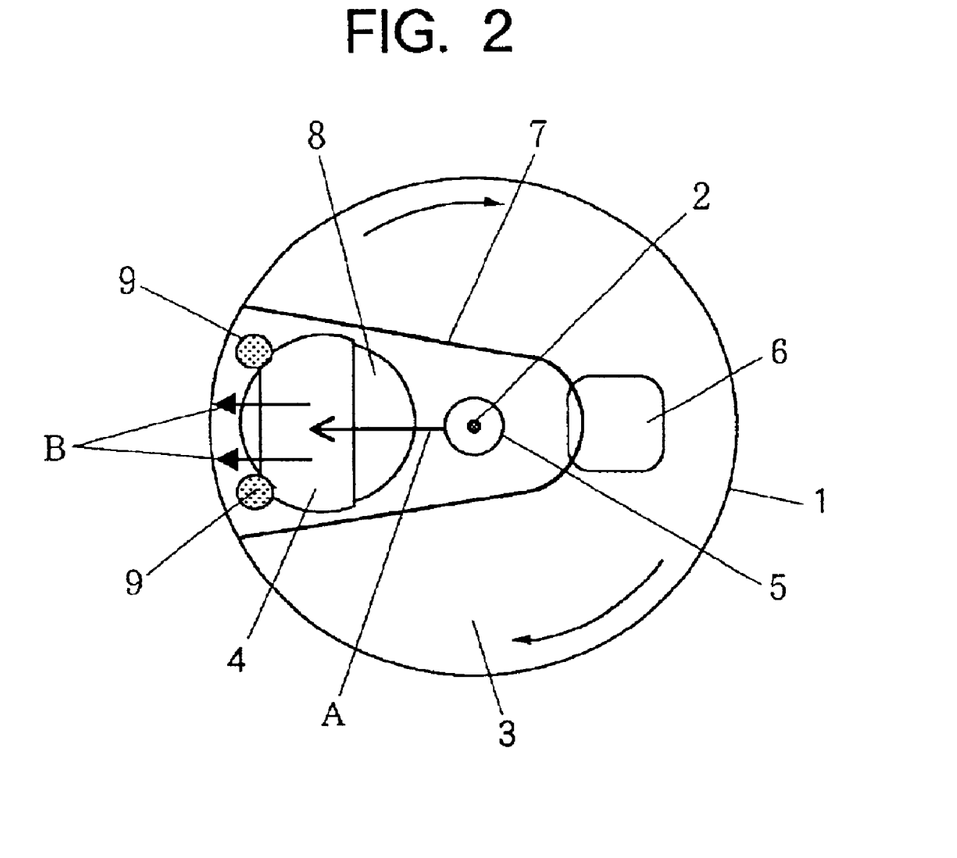
FIG. 2 is a schematic top plan view of the treatment chamber of FIG. 1.

As is illustrated in FIGS. 1 and 2, a treatment chamber unit of the treatment apparatus according to the first embodiment of the present invention is constructed of a closed treatment chamber 1 and, arranged in this treatment chamber 1, a rotary shaft 2 driven by an unillustrated motor, a rotating table 3 supported on the rotary shaft 2 and rotatable in a substantially horizontal position in the treatment chamber 1, a substrate container 4 mounted on the rotating table 3 at a position close to an inner wall of the treatment chamber 1, a nozzle 5 arranged around the rotary shaft 2, and fluid supply sources (see FIG. 4) provided with change-over devices for selectively supplying plural liquids and at least one gas (which may hereinafter be collectively called "fluids") to the nozzle 5. Further, a balancer 6 may be arranged optionally at a position diametrically opposite to the substrate container 4 with the rotary shaft 2 located therebetween to smoothen rotation of the rotating table 3. In addition, an enclosure 7 is also arranged so that each fluid sprayed or otherwise fed out from the nozzle 5 can be supplied at a desired constant flow rate onto the substrate. It is to be noted that the balancer 6 and the enclosure 7 are omitted in FIG. 1.

Upon using the apparatus shown in FIGS. 1 and 2, plural substrates 8 to be treated are stored in the substrate container 4, and the substrate container 4 with the substrates 8 stored therein is fixedly secured by a fixture 9. Subsequent to the fixing of the substrates 8, the treatment chamber 1 is brought into a closed state, the rotating table 3 is caused to turn at an appropriate speed, and a desired liquid is sprayed fed out in a direction of arrow A (toward the substrates) from the nozzle 5. The liquid makes the substrates 8 wet, and under a centrifugal force (arrow B) produced by the turning of the rotating table 3, the liquid flows in the direction of arrow B on the surfaces of the substrates 8. The liquid is sprayed for a predetermined time in this state. During this time, the liquid flows in the direction of arrow B on the surfaces of the substrates, hits the inner wall of the treatment chamber 1, downwardly flows on and along the inner wall, and is then discharged out of the system through an unillustrated passage. Mixing of the chemical and the rising water can be limited to minimum extent, for example, by firstly spraying the chemical for a time as much as needed and then spraying the rinsing water.

In the present invention, the supply of the chemical, the supply of rinsing water, and the drive of the motor M for rotating the rotary shaft (and if necessary, the supply of an inert gas) are controlled through a control panel to achieve the above-described conditions for the treatment.

In the above-described first embodiment, the closed treatment chamber 1 is provided with the substrate container 4 alone, that is, only one substrate container. The plural substrates 8 are held in a form stacked one over the other with equal intervals therebetween such that the liquid, the rinsing water and further, the gas are allowed to smoothly pass between the substrates 8. The intervals may preferably be set, for example, at 3 mm or greater.

Figure 3:
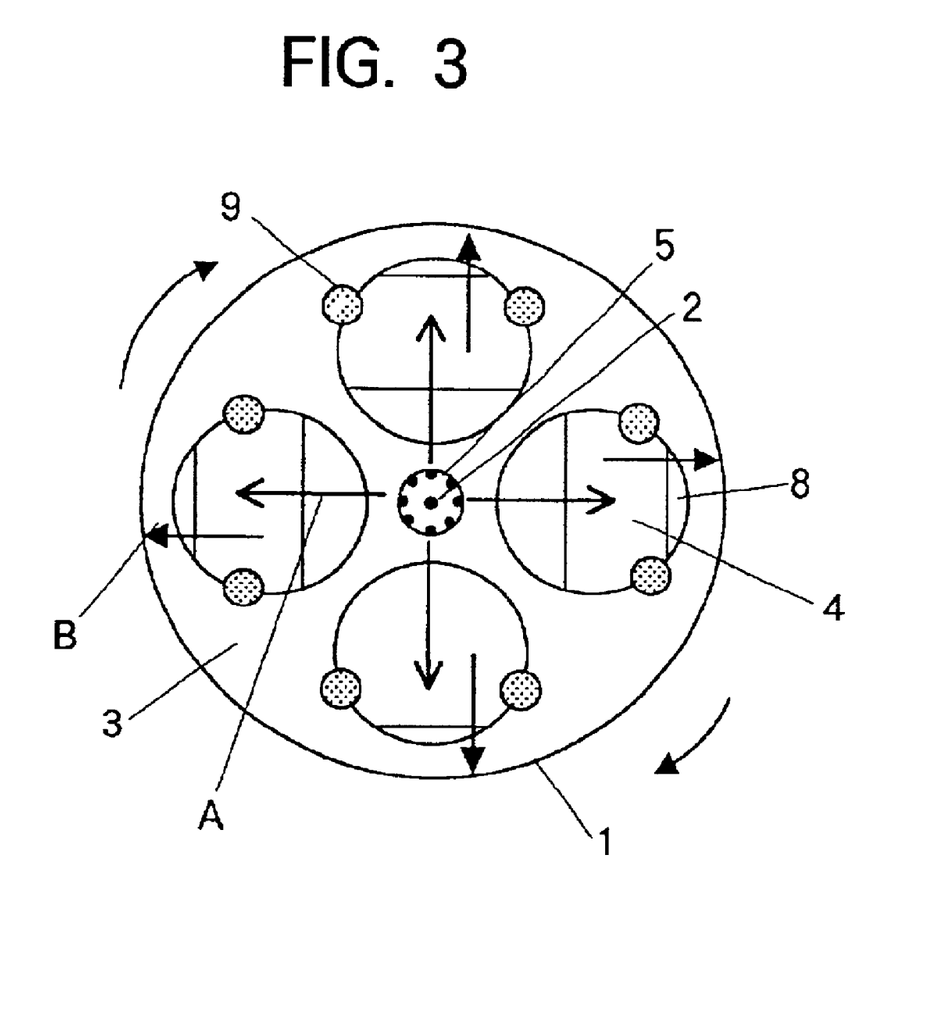
FIG. 3 is a schematic top plan view of a treatment chamber in a wet treatment apparatus according to a second embodiment of the present invention, in which the treatment chamber is provided with four substrate containers.

Referring next to FIG. 3, a description will be made of the treatment chamber in the wet treatment apparatus according to the second embodiment of the present invention. In the second embodiment, a nozzle 5 having many spray openings is arranged around the rotary shaft 2. On the rotary table 3, four substrate containers 4 are mounted around the rotary shaft 2 as a center. In each of the containers 4, plural substrates 8 can be stored. The wet treatment apparatus according to the second embodiment is operated in a similar manner as the wet treatment apparatus according to the first embodiment illustrated in FIGS. 1 and 2, so that a number of substrates 8 can be treated together. In the second embodiment, the supply of a chemical, the supply of rinsing water, and the drive of a motor for rotating the rotary shaft (and if necessary, the supply of an inert gas) are also controlled through a control panel to achieve the above-described conditions for the treatment.

Figure 4:
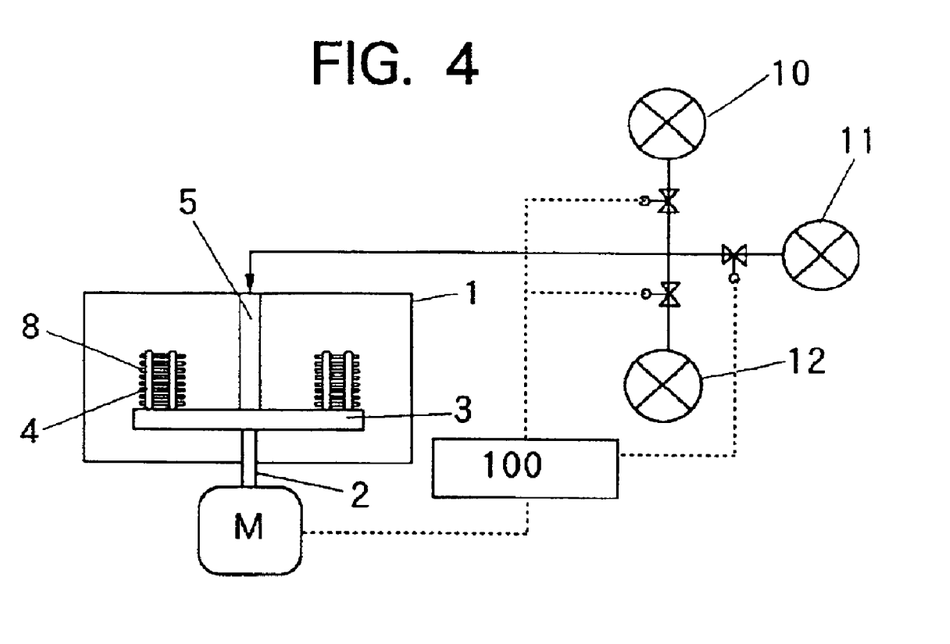
FIG. 4 is a simplified schematic view showing an illustrative fundamental construction of a wet treatment apparatus according to a third embodiment of the present invention.

FIG. 4 illustrates the outline of the wet treatment apparatus according to the third embodiment of the present invention, which is provided with two substrate containers 4. In particular, FIG. 4 illustrates control of supplies of a chemical, rinsing water and a gas such as nitrogen gas and control of rotation of a rotary shaft by a motor. Described specifically, the starts, ends and rates of supplies of a chemical 10 and rinsing water 11 (and an inert gas 12) and the rotation of a rotating table 3 by a motor M are all controlled by a program stored in a control panel 100 to achieve the above-described conditions for treatment, which are needed for the present invention. The substrates 8 are treated in a similar manner as in the first and second embodiments depicted in FIGS. 1 to 3. The substrates 8 are treated by operating the wet treatment apparatus in a similar manner as described above, purging the interiors of the treatment chambers 1, for example, with nitrogen gas or the like, and then opening a directional control valve for the chemical 10 to spray the chemical 10 for a predetermined time. After that, the directional control valve for the chemical is closed, and a directional control valve for the rinsing water is then opened to spray the rinsing water through the nozzle 5.

Figure 5:
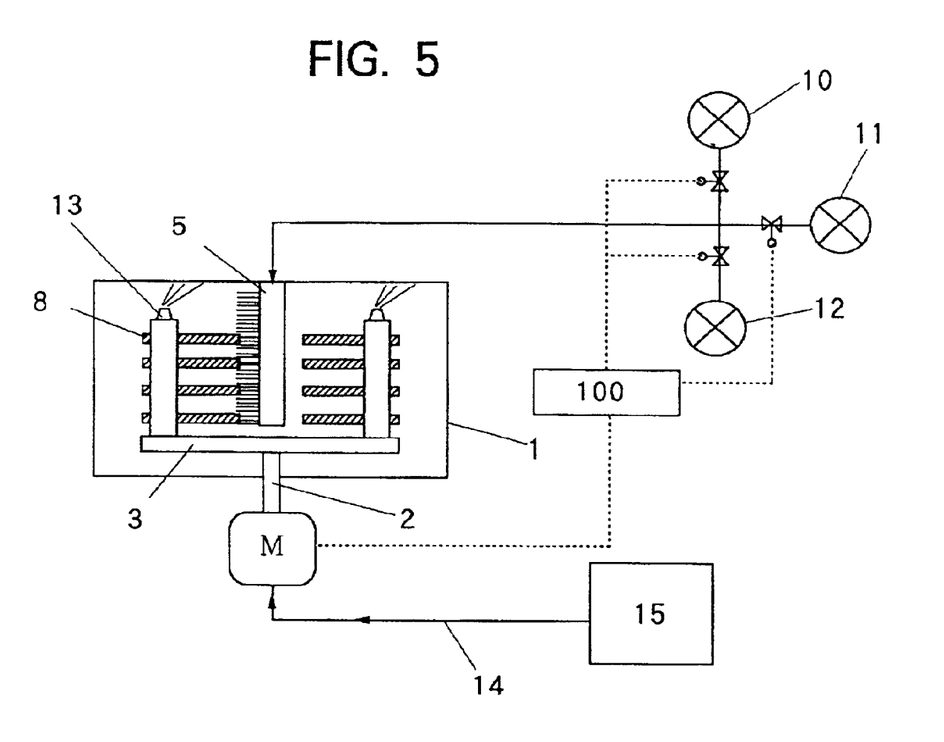
FIG. 5 is a simplified schematic view of a wet treatment apparatus according to a fourth embodiment of the present invention, which is of the large flow-rate and unidirectional spray type.

With reference to FIG. 5, a description will next be made of the wet treatment apparatus according to the fourth embodiment of the present invention. The wet treatment apparatus outlined in this diagram is of the large flow-rate and unidirectional spray type. Different from the wet treatment apparatus depicted in FIG. 4, the wet treatment apparatus according to the fourth embodiment has a nozzle 5 arranged pendant from a cover (top) of a treatment chamber 1. A chemical 10, rinsing water 11 or nitrogen gas 12 is selectively supplied to the nozzle 5 under control by a control panel 100 and sprayed or otherwise fed out in only one direction from the nozzle 5. The substrates 8 are moved by the rotating table 3 and treated with the chemical 10, the rinsing water 11 or the nitrogen gas 12 sprayed or otherwise fed out in the one direction from the nozzle 5. To spray off dust or the like which may adhere to the cover (top) of the treatment chamber 1, cover cleaning nozzles 13 are also arranged on the rotating table 3 in communication with a cleaning solution tank 15 via a suitable line 14. These cover cleaning nozzles 13 are provided with spray openings for spraying the cleaning solution toward the cover (top). Whenever the rotating table 3 is caused to turn, the cover cleaning nozzles 13 turn so that the cover (top) is cleaned with the cleaning solution sprayed from the nozzles 13. The treatment chamber 1 is sufficiently cleaned by the chemical, the rinsing water and the like except for the cover (top). The cover cleaning nozzles 13 are, therefore, arranged to clean off dust or the like adhered to the inner wall of the cover (top) when the top (cover) is opened or closed and hence to prevent contamination of the substrates. In the fourth embodiment, the supply of the chemical 10, the supply of rinsing water 11, and the drive of a motor M for rotating the rotary shaft 2 (and if necessary, the supply of the nitrogen gas) are also controlled through a control panel 100 to achieve the above-described conditions for the treatment.

As one of features of the wet treatment apparatus according to the present invention, the wet treatment apparatus has such a construction that, upon wet-treating the surfaces of the substrates 8 held as described above, each container 4 with its corresponding substrates 8 stored therein is arranged on the rotating table 3 at a position, said position being as apart as possible from the rotary shaft 2, in the treatment chamber 1 without allowing the substrates to rotate about axes of rotation inside themselves (i.e., without rotation of the substrates) and the substrates 8 are caused to revolve (see FIG. 2). The chemical remaining on the substrates 8 is exposed to a centrifugal force owing to the revolution, and is caused to fly out of the substrates. Here, the centrifugal force applied to droplets on the surface of each substrate 8 is greater than that applied when the substrate 8 is rotated, because the distance of the substrate 8 from the rotary shaft 2 is greater than the distance of the substrate 8 from the rotary shaft 2 when the substrate 8 is rotated. When a substrate is rotated, on the other hand, a centrifugal force applied around a rotary shaft is smaller than that applied on an outer side. Droplets around the rotary shaft are, therefore, applied only with weak outward energy. In the wet treatment apparatus according to the present invention, on the other hand, droplets on the surface of each substrate 8 are applied with sufficient centrifugal force over the entire surface.

Further, the wet treatment apparatus according to the present invention is usable in at least one of the chemical processing step and the rinsing step for the chemical upon fabrication of semiconductor devices. The wet treatment apparatus according to the present invention is characterized in that it is provided with the control system for, irrespective of the step, maintaining the liquid, which is flowing on a surface of the substrate, to flow at a high speed under a centrifugal force greater than gravitation and also supplying a fresh liquid of the same kind as the above-mentioned liquid at a flow rate at least equal to a discharge rate of the desired liquid only in a direction conforming with that of the centrifugal force or with that of a flow of the liquid flowing on the surface of the substrate under the centrifugal force such that the substrate is evenly treated at the surface thereof with the desired liquid while avoiding development of such a situation that flows of the liquid run against each other on the surface of the substrate or a flow of the liquid stagnates on the surface of the substrate. In this case, it is also preferred to design the control system such that the above-described treatment sub-step is conducted especially in an initial stage of the treatment. This makes it possible to perform high-speed cleaning by effecting an even liquid-to-liquid replacement exclusively on the surface of the substrate, for example, in the initial stage of the rinsing.

Firstly, by arranging the control system to apply a centrifugal force at least equal to gravitation at every location on the surface of the substrate, the liquid flowing on the surface of the substrate can be maintained to have a high velocity. In other words, droplets of the liquid on the surface of the substrate is exposed to an outward centrifugal force greater than gravitation which is acting to allow them to stay there, so that the liquid flows on the surface of the substrate. A specific method for achieving this varies depending, for example, upon the diameter of a rotating table to be used, the density of liquid droplets remaining on the surface of the substrate, and the viscosity of a liquid to be used. In essence, however, this can be achieved by controlling the turning speed of the rotating table by the control system such that the substrate is caused to revolve at a high speed. Described specifically, when the diameter of the rotating table 4 on which the substrates are mounted is 60 cm, for example, the turning speed of the rotating table 4 may be set in a range of from 300 to 500 rpm or so, preferably from 500 to 700 rpm or so by also taking economy and the like into consideration.

Figure 6:
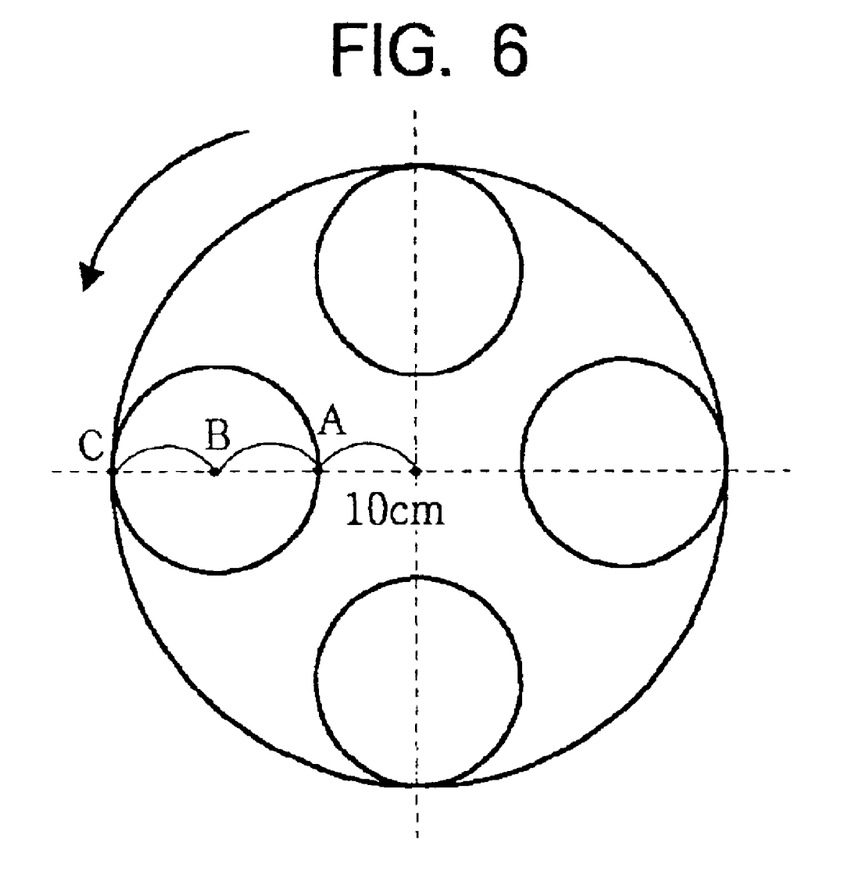
FIG. 6 is a diagram explaining differences among centrifugal forces applied to a liquid at indicated points, respectively, when a substrate is caused to revolve, in other words, to turn around an axis of rotation outside the substrate itself.
Figure 7:
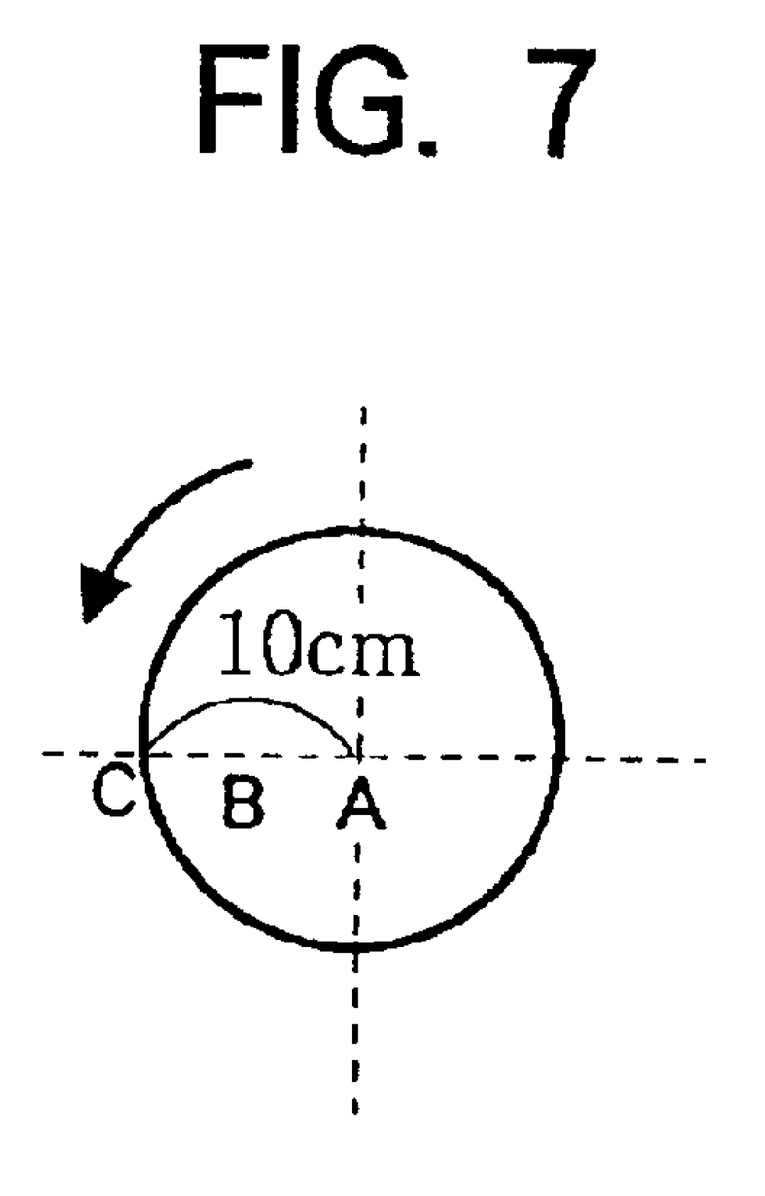
FIG. 7 is a diagram explaining differences among centrifugal forces applied to a liquid at indicated points, respectively, when a substrate is caused to rotate about an axis of rotation inside the substrate itself.

With respect to the model shown in FIG. 6 where each substrate was caused to revolve around an axis of rotation outside itself and the model illustrated in FIG. 7 where each substrate was caused to rotate around an axis of rotation inside itself, centrifugal forces applied to individual positions on the substrates were calculated. The results are presented in Table 1. As is clearly envisaged from the results, when the diameter of the rotating table 3 is 60 cm, setting of the turning speed of the rotating table at 300 rpm or higher makes it possible to apply a centrifugal force at least equal to gravitation at all the points A to C on the substrate 8 in the case of FIG. 6 in which the substrate 8 is arranged on an outer side farther from the axis of rotation and is caused to revolve. In the case of the rotation type in FIG. 7 in which the substrate 8 rotates around an axis of rotation inside itself, no substantial centrifugal force is applied to a central area where the axis of rotation is located, and even in other areas, centrifugal forces applied are smaller than those applied in the case of FIG. 6.

TABLE 1

Centrifugal Forces Applied to Individual Points When Revolved at Different Rotational Speeds

| Rotational speed | | Centrifugal acceleration (m/S²; a centrifugal force is proportional to a centrifugal acceleration) | | |
|---|---|---|---|---|
| R (rpm) | R/60 (rps) | Point A | Point B | Point C |
| 20 | 0.33 | 0.438 | 0.876 | 1.315 |
| 60 | 1 | 3.944 | 7.888 | 11.832 |
| 120 | 2 | 15.775 | 31.551 | 47.326 |
| 160 | 2.66 | 28.045 | 56.090 | 84.135 |
| 200 | 3.33 | 43.821 | 87.641 | 131.461 |
| 300 | 5 | 98.596 | 197.192 | 295.788 |
| 500 | 8.33 | 273.88 | 547.756 | 821.633 |

Centrifugal Forces Applied to Individual Points When Rotated at Different Rotational Speeds

| Rotational speed | | Centrifugal acceleration* (m/S²; a centrifugal force is proportional to a centrifugal acceleration) | | |
|---|---|---|---|---|
| R (rpm) | R/60 (rps) | Point A | Point B | Point C |
| 60 | 1 | 0 | 1.972 | 3.944 |
| 120 | 1.66 | 0 | 5.478 | 10.955 |
| 500 | 8.33 | 0 | 136.939 | 273.878 |
| 1000 | 16.66 | 0 | 547.756 | 1095.511 |
| 1500 | 25.00 | 0 | 1232.45 | 2464.9 |
| 2000 | 33.33 | 0 | 2191.022 | 4382.044 |

*Centrifugal acceleration a at distance r (m) from the axis of rotation: $a = r\omega^2$ ($\omega$: angular speed, $\omega = 2\pi \times$ rotational speed $= \pi R/30$ (rad/sec))

The wet treatment apparatus according to the present invention is constructed such that, upon performing rinsing treatment subsequent to processing with a chemical to remove the chemical under conditions required for the present invention and established by the control system, the rinsing treatment is conducted while feeding a fresh supply of a liquid (for example, rinsing water) only in a direction conforming with a flow of a liquid produced on the surface of the substrate as described above. At this time, it is also controlled such that the rinsing treatment is conducted while the fresh supply of the liquid is fed at a rate at least equal to a discharge rate of the liquid.

As has been described above, use of the wet treatment apparatus according to the present invention makes it possible to accelerate the replacement with the fresh supply of the liquid. It is, therefore, possible to effectively avoid a phenomenon such as an increase in chemical etching rate which, as mentioned above, takes place if the rinsing water is gradually mixed to the chemical (for example, if the rinsing water was caused to stand up on the surface of the substrate). In particular, the inclusion of the above-described treatment sub-step in an initial stage of the treatment makes it possible to replace the chemical on the surface of the substrate with the rinsing water in a stage that the rinsing water has been used only in a small amount and, therefore, to decrease the overall consumption of the rinsing water and the overall time required for the rinsing. Further, as the rinsing water swiftly flows off from the surface of the substrate, a still further advantageous effect can be brought about in that even the inner wall of the treatment chamber is cleaned in the above-described sub-step. Accordingly, the chemical adhered on the inner wall of the treatment chamber can also be replaced with the fresh supply of rinsing water at the same time. This makes it extremely easier to clean the interior of the treatment chamber after the treatment compared with the conventional apparatuses.

As a specific method for feeding the fresh supply of rinsing water only in the direction conforming with the flow of liquid on the surface of the substrate, the nozzle 5 may be arranged with its spray openings aligned in a similar vertical direction as the rotary shaft, and the rinsing water may be sprayed from the spray openings toward the inner wall of the treatment chamber (see FIGS. 1 and 2).

The wet treatment method and apparatus of the present invention as described above are usable in at least one of a chemical processing step and a rinsing step, both of which are conducted upon fabrication of semiconductor devices. These method and apparatus are used especially to evenly and promptly perform the liquid-to-liquid replacement which is effected in the step. These method and apparatus can be used most suitably when the chemical employed in the chemical processing step is, for example, one having such a high viscosity and/or adhesion as tending to allow it to remain on the surface of the substrate, one with an organic substance contained therein, or one having such a property that its etching rate quickly increases when mixed with water. Illustrative of the chemical which tends to remain abundantly on the surface of the substrate are sulfuric acid, SPM (sulfuric acid-hydrogen peroxide mixture), and tartaric acid. When the wet treatment method according to the present invention is used, for example, upon rinsing such a chemical with water, the chemical remaining on the surface of the substrate is promptly and evenly replaced with water supplied in the rinsing step.

The wet treatment method and apparatus according to the present invention are also effective when a chemical contains an organic solvent such as DMSO (dimethyl sulfoxide), NMP (N-methylpyrrolidone) or DMF (N,N-dimethylformamide). When one containing an acid or alkali dissolved in such an organic solvent is used as a chemical, subsequent rinsing with water promotes dissociation of the acid or alkali and leads to a substantial change in pH. As a result, the etching rate increases, and in some instances, corrosion of AlCu patterns and/or interconnections formed on the surface of the substrate may occur. In contrast, use of the wet treatment apparatus according to the present invention can prevent or substantially reduce the occurrence of corrosion of such metallization patterns and/or interconnections although rinsing with water is conducted.

For example, in a polymer stripping step which is conducted subsequent to the formation of AlCu patterns and/or interconnections on a surface of a substrate, unnecessary polymer is stripped with a stripper solution containing ammonium fluoride, and then, rinsing is performed using water as a rinsing liquid to remove the stripper solution and polymer residues still remaining on the surface of the substrate. For such rinsing treatment, the wet treatment apparatus according to the present invention is suited. When gradually mixed with water, the stripper solution with ammonium fluoride contained therein quickly increases in etching rate and may cause corrosion of AlCu patterns and/or interconnections formed on the surface of the substrate. Use of the wet treatment apparatus according to the present invention, however, makes it possible to prevent or otherwise substantially reduce the occurrence of corrosion of metallization patterns and/or interconnections although rinsing with water is conducted without performing intermediate or provisional rinsing. Further, the above-described chemical remaining on the surface of the substrate is promptly and evenly replaced with water in an initial stage of the rinsing treatment. As a result, it is possible to reduce the overall time and water consumption required for the rinsing treatment. As the rinsing water swiftly flows off from the surface of the substrate, a still further advantageous effect can be brought about in that the inner wall of the treatment chamber is also cleaned at the same time and the chemical adhered on the inner wall can also be replaced with the fresh supply of rinsing water.

Use of the wet treatment apparatus according to the present invention is by no means limited to the rinsing method in the above-described specific case, but it can be applied to general wet treatments. Irrespective of the wet treatment, the wet treatment apparatus according to the present invention can feed a fresh supply of liquid to a treated surface and can achieve a liquid-to-liquid replacement with high efficiency.

The present invention will next be described in further detail based on Examples and Comparative Examples.

EXAMPLES 1–2 & COMPARATIVE EXAMPLES 1–2

Subsequent to an etching treatment conducted upon formation of AlCu patterns and/or interconnections on surfaces of silicon wafers, residues were treated with a stripper containing ammonium fluoride and then, the surfaces of the silicon wafers were washed with water by using a modified model (FIGS. 4 and 5) of "MERCURY" (trade name; manufactured by FSI International, Inc.). This apparatus can be effectively used for pre-cleaning of substrates, post-etch stripping of a resist and other cleaning treatments upon fabrication of semiconductor devices. In a closed chamber (treatment chamber 1) purged with nitrogen gas, substrates 8 can be subjected at surfaces thereof to a series of treatments including chemical processing, rinsing for the chemical and subsequent drying. As is illustrated in FIG. 5, the modified model is provided in the chamber with a rotating table, and around a rotary shaft, containers are arranged to hold substrates. A nozzle is arranged with its spray openings aligned in a similar vertical direction as the rotary shaft. The apparatus is constructed such that a chemical or a rinsing liquid can be sprayed from the nozzle toward the substrates while being controlled by the above-described control system.

Substrates, which had been subjected to etching and carried AlCu patterns and/or interconnections thereon, were placed in the substrate containers mounted on the rotating table. After spraying a stripper with ammonium fluoride contained therein against the substrates and treating them with the stripper, water was sprayed through the nozzle to conduct rinsing. Conditions for the rinsing treatment conducted in an initial stage of rinsing in Examples 1–2 and Comparative Examples 1–2, respectively, are presented in Table 2.

(Ranking)
(1) Extent of Corrosion

To investigate the efficiency of the rinsing treatment under the respective conditions, the extent of corrosion of AlCu patterns and/or interconnections on the surfaces of the substrates after the rinsing treatment was determined. Described specifically, the surfaces of the substrates were observed under a microscope and were ranked in accordance with the following ranking standard. The results of the ranking are presented in Table 2.

A: Absolutely no corrosion is observed on any of metallization patterns and/or interconnections.

B: Only slight corrosions are observed on some of metallization patterns and/or interconnections.

C: Corrosions are observed to such extent as making side walls of metallization patterns and/or interconnections uneven.

D: Substantial corrosion-related reductions in width are observed on metallization patterns and/or Interconnections.

(2) Amount of Residues (Particles)

To investigate the efficiency of the rinsing treatment under the respective conditions, the amount of residues lifted off onto the surfaces of the substrates after the rinsing treatment was determined by SEM observation. The results of the observation were ranked in accordance with the following ranking standard. The results of the ranking are presented in Table 2.

A: Absolutely no particle is observed anywhere on the surface of the substrate.

B: Particles are observed.

As standards for determining the efficiency of rinsing, there are the restoration speed of pH in a drain and the consumption of rinsing water. Based on the differences in conditions among Examples 1–2 and Comparative Examples 1–2, differences were observed as will be described hereinafter. In this test, pH 5 and higher were assumed to be a corrosion-free, safety range. Under each of the conditions, the time required until the pH of a drain returns to pH 5 was measured. The results are presented in Table 3. As is evident from Table 3, in the case of Example 1, pH 5 was restored quickly in a stage that the consumption of rinsing water was still small. It was, therefore, confirmed that the stripper remaining on the surfaces of the substrates was promptly replaced with water. After the treatment, the pH of droplets adhered on the inner wall of each chamber was measured. The pH was found to be 5 or higher. Accordingly, it was also confirmed that the inner wall of each chamber had been cleaned well.

TABLE 3 pH Restoration Time and Rinsing Water Consumption Required to Reach Corrosion-free, Safety Range

|  | Supply rate (L/min) | Rotational speed (rpm) | pH restoration time (sec) | Rinsing water consumption (L) |
|---|---|---|---|---|
| Example 1 | 20 | 500 | 7 | 2.3 |
| Example 2 | 13 | 500 | 15 | 3.3 |
| Comp. Ex. 1 | 20 | 20 | 40 | 13.3 |
| Comp. Ex. 2 | 13 | 20 | 93 | 20.1 |

What is claimed is:

1. A wet treatment method useful in at least one of a chemical processing step and a rinsing step performed upon fabrication of semiconductor devices, which comprises a sub-step in which:

a substrate under treatment is treated with a desired liquid while causing said substrate to revolve around an axis of rotation outside said substrate such that said desired liquid flowing on a surface of said substrate is maintained flowing under a centrifugal force greater than gravitation, the surface of the substrate disposed on a horizontal plane perpendicular to the axis of rotation, and said substrate is treated while supplying an additional amount of said desired liquid at a flow rate at least equal to a discharge rate of said desired liquid, the additional amount of the desired liquid provided to the substrate only in a direction perpendicular to the axis of rotation, while directly spraying with the desired liquid only a top cover of a chamber in which the desired liquid is supplied to the substrate,

TABLE 2

Corrosion Preventing Ability

|  |  |  |  |  | Ranking results | |
|---|---|---|---|---|---|---|
|  | Supply rate (L/min) | Discharge rate (L/min) | Rotational speed (rpm) | Comparison in magnitude between gravitation and centrifugal force on substrate surface | Corrosion | Particle removing ability |
| Example 1 | 20 | 20 | 500 | Gravitation < centrifugal force | A | A |
| Example 2 | 13 | 13 | 500 | Gravitation < centrifugal force | B | A |
| Comp. Ex. 1 | 20 | 20 | 20 | Gravitation > centrifugal force | C | B |
| Comp. Ex. 2 | 13 | 13 | 20 | Gravitation > centrifugal force | D | B | whereby said substrate is evenly treated at said surface thereof with said desired liquid while avoiding development of such a situation that flows of said desired liquid run against each other on said surface of said substrate or a flow of said desired liquid stagnates on said surface of said substrate.

2. The wet treatment method according to claim 1, wherein said desired liquid has a high viscosity, a high adhesion, or contains an organic substance.

3. The wet treatment method according to claim 1, wherein said sub-step is conducted before a final treatment in at least one of said chemical processing step and said rinsing step.

4. The wet treatment method according to claim 3, wherein said wet treatment method is used in said rinsing step such that the desired liquid is used to rinse a chemical employed in said chemical processing step; and said chemical employed in the chemical processing step has a high viscosity, high adhesion, contains an organic substance, or has an etching rate that increases when mixed with water.

5. The wet treatment method according to claim 2, wherein said wet treatment method is used in said rinsing step such that the desired liquid is used to rinse a chemical employed in said chemical processing step; and said chemical used in the chemical processing step comprises a solution of at least one of amines and ammonium fluoride dissolved as an effective component in an organic solvent or a water-containing organic solvent.

6. A wet treatment method according to claim 1, wherein said desired liquid comprises pure water.

7. The wet treatment method according to claim 1, wherein a nozzle sprays the top cover of the chamber, the nozzle disposed on a rotating table on which the substrate is disposed.

8. The wet treatment method according to claim 1, wherein directly spraying comprises directly spraying the desired liquid from a nozzle, the nozzle configured to directly spray only the top cover of the chamber.

9. The wet treatment method according to claim 8, wherein the nozzle is disposed on a table on which the substrate is disposed.

10. The wet treatment method according to claim 1, wherein a plurality of nozzles configured to clean the top cover with the desired liquid spray only the top cover of the chamber.

11. A method of treating a substrate, comprising:
rotating the substrate about an axis disposed apart from the substrate, a surface of the substrate disposed on a horizontal plane perpendicular to the axis;
supplying a liquid to treat the surface of the substrate in a direction only perpendicular to the axis; and
directly spraying with the liquid only a top cover of a chamber in which the liquid is supplied to the substrate, whereby said substrate is evenly treated at said surface thereof with said liquid while avoiding development of such a situation that flows of said liquid run against each other on said surface of said substrate or a flow of said liquid stagnates on said surface of said substrate.

12. The method according to claim 11, wherein the substrate is rotated such that a centrifugal force is greater than a gravitational force.

13. The method according to claim 11, wherein supplying comprises supplying the liquid at a rate at least equal to a rate of removal of the liquid from the substrate due to a centrifugal force.

14. The method according to claim 11, wherein rotating comprises rotating the substrate such that the supplied liquid flows in a direction of liquid flow from the substrate due to a centrifugal force.

15. The method according to claim 14, wherein the liquid comprises water.

16. The method according to claim 15, wherein the liquid comprises chemical etchant.

17. The method according to claim 11, wherein a nozzle sprays the top cover of the chamber, the nozzle disposed on a rotating table on which the substrate is disposed.

18. The method according to claim 11, wherein directly spraying comprises directly spraying the liquid from a nozzle, the nozzle configured to directly spray only the top cover of the chamber.

19. The method according to claim 18, wherein the nozzle is disposed on a table on which the substrate is disposed.

20. The method according to claim 11, wherein a plurality of nozzles configured to clean the top cover with the liquid spray only the top cover of the chamber.

* * * * *